US010686413B2

(12) United States Patent
Yoo et al.

(10) Patent No.: US 10,686,413 B2
(45) Date of Patent: Jun. 16, 2020

(54) LOW NOISE AMPLIFIER CIRCUIT WITH MULTIPLE-INPUT MULTIPLE-OUTPUT (MIMO) STRUCTURE

(71) Applicant: Samsung Electro-Mechanics Co., Ltd., Suwon-si (KR)

(72) Inventors: Hyun Hwan Yoo, Suwon-si (KR); Jong Mo Lim, Suwon-si (KR); Yoo Sam Na, Suwon-si (KR); Hyun Jin Yoo, Suwon-si (KR); Hyung Jun Cho, Suwon-si (KR); Yoo Hwan Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 33 days.

(21) Appl. No.: 16/166,295

(22) Filed: Oct. 22, 2018

(65) Prior Publication Data

US 2019/0334488 A1 Oct. 31, 2019

(30) Foreign Application Priority Data

Apr. 26, 2018 (KR) ........................ 10-2018-0048423

(51) Int. Cl.
*H03F 1/32* (2006.01)
*H03F 3/195* (2006.01)
*H04B 7/0413* (2017.01)

(52) U.S. Cl.
CPC ........ *H03F 3/195* (2013.01); *H03F 2200/111* (2013.01); *H03F 2200/222* (2013.01);
(Continued)

(58) Field of Classification Search
CPC ......... H03F 1/3252; H03F 1/07; H03F 1/0288
(Continued)

(56) References Cited

U.S. PATENT DOCUMENTS 7,138,862 B2 * 11/2006 Araki .................... H03F 1/0277
330/126
8,536,950 B2 * 9/2013 Nejati ..................... H03F 1/565
330/302
(Continued)

FOREIGN PATENT DOCUMENTS

KR 10-0789918 B1 1/2008
KR 10-2008-0111954 A 12/2008
(Continued)

OTHER PUBLICATIONS

Korean Office Action dated Jun. 19, 2019 in corresponding Korean Patent Application No. 10-2018-0048423 (6 pages in English, 6 pages in Korean).

*Primary Examiner* — Henry Choe
(74) *Attorney, Agent, or Firm* — NSIP Law

(57) ABSTRACT

A low noise amplifier circuit includes a first low noise amplifier including a common gate structure cascoded with a parallel common source structure to selectively amplify a band signal among first and second band signals; a second low noise amplifier including a common gate structure cascoded with a parallel common source structure to selectively amplify a band signal among third and fourth band signals; an output DPDT circuit including a first input terminal connected to the first low noise amplifier, a second input terminal connected to the second low noise amplifier, and a first output terminal and a second output terminal for selectively outputting signals input through the first input terminal and the second input terminal; and a control circuit performing an amplification control and a switching control for the first and second low noise amplifiers and the output DPDT circuit in response to a predetermined communications scheme.

18 Claims, 6 Drawing Sheets

(52) U.S. Cl.
CPC .. *H03F 2200/294* (2013.01); *H03F 2200/387* (2013.01); *H03F 2200/417* (2013.01); *H03F 2200/451* (2013.01); *H03F 2200/72* (2013.01); *H03F 2200/75* (2013.01); *H04B 7/0413* (2013.01)

(58) Field of Classification Search
USPC ...................................... 330/126, 124 R, 295
See application file for complete search history.

(56) References Cited

U.S. PATENT DOCUMENTS

| | | | | |
|---|---|---|---|---|
| 8,653,889 | B1* | 2/2014 | Acimovic | H03F 1/0288 |
| | | | | 330/124 R |
| 8,830,000 | B2* | 9/2014 | Jeong | H03F 1/223 |
| | | | | 330/126 |
| 8,890,620 | B2* | 11/2014 | Tamanoi | H03F 1/56 |
| | | | | 330/124 R |
| 9,154,357 | B2* | 10/2015 | Tasic | H03F 3/68 |
| 9,337,775 | B1 | 5/2016 | Ilkov et al. | |
| 2012/0044606 | A1* | 2/2012 | Jones | H03F 1/52 |
| | | | | 361/56 |
| 2014/0170990 | A1 | 6/2014 | Black et al. | |
| 2016/0268980 | A1 | 9/2016 | Seong et al. | |

FOREIGN PATENT DOCUMENTS

| | | |
|---|---|---|
| KR | 10-2010-0014861 A | 2/2010 |
| KR | 10-2015-0103318 A | 9/2015 |
| KR | 10-2016-0109931 A | 9/2016 |
| KR | 10-1781998 B1 | 9/2017 |
| WO | WO 2014/116687 A2 | 7/2014 |
| WO | WO 2015/069417 A1 | 5/2015 |

* cited by examiner

LOW NOISE AMPLIFIER CIRCUIT WITH MULTIPLE-INPUT MULTIPLE-OUTPUT (MIMO) STRUCTURE

CROSS-REFERENCE TO RELATED APPLICATION

This application claims the benefit under 35 USC 119(a) of Korean Patent Application No. 10-2018-0048423 filed on Apr. 26, 2018 in the Korean Intellectual Property Office, the entire disclosure of which is incorporated herein by reference for all purposes.

BACKGROUND

Field

The following description relates to a low noise amplifier circuit with a multiple-input multiple-output (MIMO) structure capable of supporting carrier aggregation (CA).

Description of Related Art

A front-end structure of a receiver has recently been manufactured as modules having various forms depending on intended country of use, frequency band, and application. In particular, in order to improve reception sensitivity in a high specification terminal, a structure having L-PAMiD (LNA+PAMiD) form, which is PAMiD (Power Amplifier Module With integrated Duplexer) form, including a low noise amplifier (LNA), is developed in a module.

The L-PAMiD module generally includes a low band type, a mid-band type, and a high band type, and frequency bands that need to be supported are also diverse. In particular, in the case of the high band type, B30/B40/B41/B7 is mainly used. B40/B41 supports a time-division duplexing (TDD) scheme and B30/B7 supports a frequency-division duplexing (FDD) scheme.

In addition, in order to implement a high data rate, B40/B41 and B40/B7 should support carrier aggregation (CA). In order to increase reception sensitivity of the high band L-PAMiD type of module, insertion loss performance of a filter (e.g., surface acoustic wave (SAW)/bulk acoustic wave (BAW)) is also important, but noise figure (NF) performance of the LNA is also important.

Meanwhile, in mobile communications, it is recently required to support carrier aggregation (CA) to process high data rates. This requires different LNAs for signals existing in similar frequency bands. For example, in order to perform the carrier aggregation (CA) for B40 (2.3 to 2.4 GHz) and B41 (2.5 to 2.7 GHz), two LNAs optimized for B40 and B41 are required. In addition, in order to perform the carrier aggregation (CA) for B30 (2.35 to 2.36 GHz) and B7 (2.62 to 2.69 GHz), two LNAs are similarly required. That is, in order to support the carrier aggregation (CA) for four bands (B30/B40/B41/B7), the LNA supporting four inputs and two outputs is required.

As one conventional low noise amplifier circuit, there is a multi-input LNA using a single pole multi throw (SPMT) switch in an input terminal.

In the case of such an LNA structure, since switching loss has important effect on the overall noise figure, there is a problem that deterioration in the noise figure (NF) due to switching loss may occur.

In addition, in a case in which the conventional low noise amplifier circuit uses the switch at the input terminal, when the number of used switch elements is increased, there is a problem that switching loss is increased.

As the other of the conventional noise lower amplifier circuits, there is a structure in which the input terminal is used separately for each of the bands and an output terminal is shared.

Such an LNA structure is a general structure for implementing multiple-input multiple-output (MIMO), and since the structure needs to implement a matching circuit in each input terminal, many matching components are required in view of a module, and since the output terminal is shared, isolation characteristics are deteriorated.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a low noise amplifier circuit includes a first low noise amplifier including a first common gate structure cascoded with a first parallel common source structure to selectively amplify a band signal among a first band signal and a second band signal; a second low noise amplifier including a second common gate structure cascoded with a second parallel common source structure to selectively amplify a band signal among a third band signal and a fourth band signal; an output DPDT circuit including a first input terminal connected to the first low noise amplifier, a second input terminal connected to the second low noise amplifier, and a first output terminal and a second output terminal for outputting signals input through the first input terminal and the second input terminal; and a control circuit performing an amplification control and a switching control for the first and second low noise amplifiers and the output DPDT circuit in response to a predetermined MIMO communications scheme or a carrier aggregation (CA) communications scheme.

The first low noise amplifier may include a first common source amplifier circuit including a first parallel common source transistor to amplify the band signal among the first band signal and the second band signal; and a first common gate amplifier circuit including a first common gate transistor cascoded with the first parallel common source transistor to amplify the band signal that has been amplified by the first common source amplifier circuit.

The second low noise amplifier may include a second common source amplifier circuit including a second parallel common source transistor to amplify the selected band signal among the third band signal and the fourth band signal; and a second common gate amplifier circuit including a second common gate transistor cascoded with the second parallel common source transistor to amplify the selected band signal that has been amplified by the second common source amplifier circuit.

The first low noise amplifier may include a first output impedance circuit connected between an output terminal of the first low noise amplifier and a first power supply terminal, and the first output impedance circuit may include a first coil connected between the output terminal of the first low noise amplifier and the first power supply terminal; a first gain variable resistor connected to the first coil in parallel; a first frequency variable capacitor connected to the first coil in parallel; and a first variable impedance circuit connected to the output terminal of the first low noise amplifier to vary output impedance of the first low noise amplifier.

The second low noise amplifier may include a second output impedance circuit connected between an output terminal of the second low noise amplifier and a second power supply terminal, and the second output impedance circuit may include a second coil connected between the output terminal of the second low noise amplifier and the second power supply terminal; a second gain variable resistor connected to the second coil in parallel; a second frequency variable capacitor connected to the second coil in parallel; and a second variable impedance circuit connected to the output terminal of the second low noise amplifier to vary output impedance of the second low noise amplifier.

The output DPDT circuit may include a first switch connected between the first input terminal and the first output terminal; a second switch connected between the first input terminal and the second output terminal; a third switch connected between the second input terminal and the first output terminal; and a fourth switch connected between the second input terminal and the second output terminal.

Each of the first switch, the second switch, the third switch, and the fourth switch may be formed to have a T-shaped structure including three switch elements.

According to another general aspect, a low noise amplifier circuit includes a first input matching circuit performing individual matching for each of a first band signal and a second band signal; a second input matching circuit performing individual matching for each of a third band signal and a fourth band signal; a first low noise amplifier including a first common gate structure cascoded with a first parallel common source structure to selectively amplify a band signal among the first band signal and the second band signal in response to an input amplification control; a second low noise amplifier including a second common gate structure cascoded with a second parallel common source structure to selectively amplify a band signal among the third band signal and the fourth band signal in response to the input amplification control; and an output DPDT circuit including a first input terminal connected to the first low noise amplifier, a second input terminal connected to the second low noise amplifier, and a first output terminal and a second output terminal for outputting signals input through the first input terminal and the second input terminal in response to an input switching control.

The first low noise amplifier may include a first common source amplifier circuit including a first parallel common source transistor to amplify the band signal among the first band signal and the second band signals; and a first common gate amplifier circuit including a first common gate transistor cascoded with the first parallel common source transistor to amplify the band signal that has been amplified by the first common source amplifier circuit.

The second low noise amplifier may include a second common source amplifier circuit having a second parallel common source structure to amplify the selected band signal among the third band signal and the fourth band signal; and a second common gate amplifier circuit including a second common gate transistor cascoded with the second parallel common source transistor to amplify the selected band signal that has been amplified by the second common source amplifier circuit.

The first low noise amplifier may include a first output impedance circuit connected between an output terminal of the first low noise amplifier and a first power supply terminal, and the first output impedance circuit may include a first coil connected between the output terminal of the first low noise amplifier and the first power supply terminal; a first gain variable resistor connected to the first coil in parallel; a first frequency variable capacitor connected to the first coil in parallel; and a first variable impedance circuit connected to the output terminal of the first low noise amplifier to vary output impedance of the first low noise amplifier.

The second low noise amplifier may include a second output impedance circuit connected between an output terminal of the second low noise amplifier and a second power supply terminal, and the second output impedance circuit may include a second coil connected between the output terminal of the second low noise amplifier and the second power supply terminal; a second gain variable resistor connected to the second coil in parallel; a second frequency variable capacitor connected to the second coil in parallel; and a second variable impedance circuit connected to the output terminal of the second low noise amplifier to vary output impedance of the second low noise amplifier.

The output DPDT circuit may include a first switch connected between the first input terminal and the first output terminal; a second switch connected between the first input terminal and the second output terminal; a third switch connected between the second input terminal and the first output terminal; and a fourth switch connected between the second input terminal and the second output terminal.

Each of the first switch, the second switch, the third switch, and the fourth switch may be formed to have a T-shaped structure including three switch elements.

In another general aspect, a low noise amplifier includes a first input terminal; a second input terminal; an output terminal; parallel common source transistors to receive a first band signal through the first input terminal and a second band signal through the second input terminal and to selectively amplify one of the first band signal and the second band signal; common gate transistors cascoded with the parallel common source transistors to amplify the selected one of the first band signal and the second band signal that has been amplified by the parallel common source transistors; and an output impedance circuit connected to the output terminal to vary output impedance of the low noise amplifier.

The output impedance circuit may include a coil connected between the output terminal and a power supply terminal, a gain variable resistor connected in parallel to the coil, a frequency variable capacitor connected in parallel to the coil, a direct current blocking capacitor connected between an output of the common gate transistors and the output terminal, a first gain variable capacitor connected in parallel to the direct current blocking capacitor, and a second gain variable capacitor connected between the power supply terminal and the output terminal.

The parallel common source transistors may selectively amplify the one of the first band signal and the second band signal based on a received amplification control signal.

The parallel common source transistors may selectively amplify the one of the first band signal and the second band signal based on a multiple input multiple output communications scheme or a carrier aggregation communications scheme.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
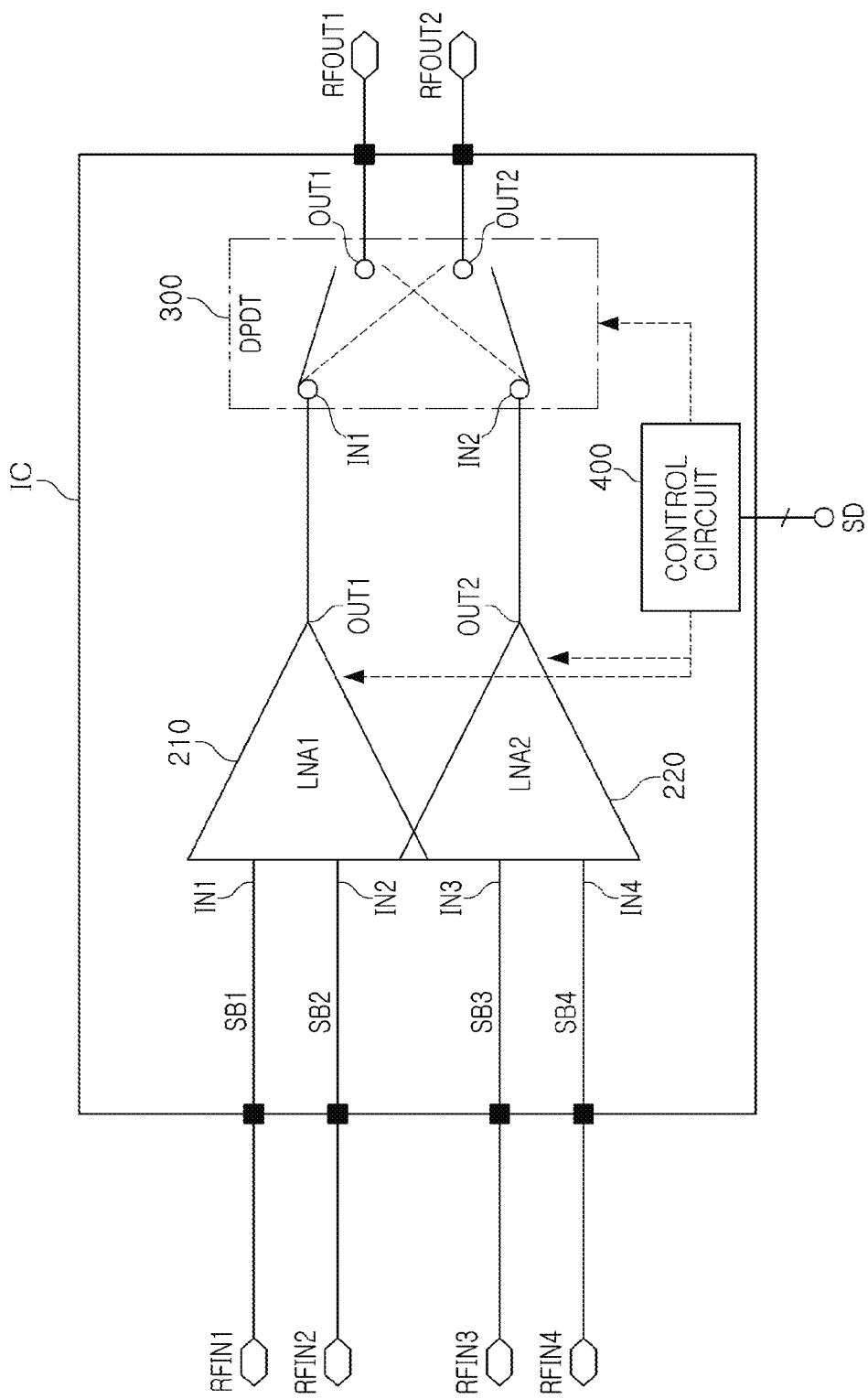
FIG. 1 is a schematic view of a low noise amplifier circuit according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a schematic view of a low noise amplifier circuit according to an example. Referring to FIG. 1, a low noise amplifier circuit according to an example may include a first low noise amplifier 210, a second low noise amplifier 220, an output DPDT circuit 300, and a control circuit 400.

Figure 2:
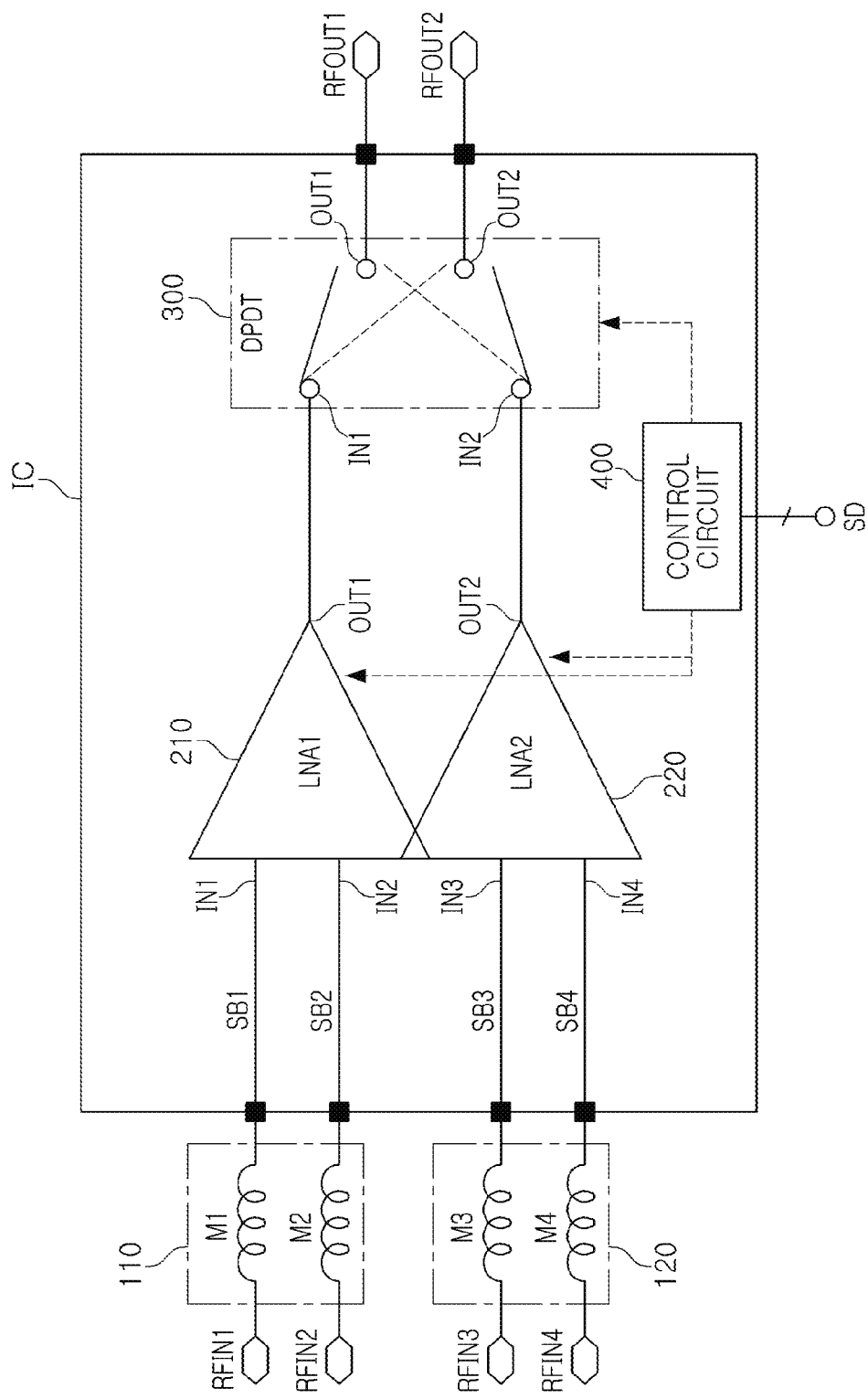
FIG. 2 is an illustrative view of a low noise amplifier circuit according to an example.

FIG. 2 is an illustrative view of the low noise amplifier circuit according to an example. Referring to FIG. 2, the low noise amplifier circuit according to an example may include a first input matching circuit unit 110, a second input matching circuit unit 120, the first low noise amplifier 210, the second low noise amplifier 220, the output DPDT circuit 300, and the control circuit 400.

As an example, the first input matching circuit unit 110, the second input matching circuit unit 120, the first low noise amplifier 210, the second low noise amplifier 220, the output DPDT circuit 300, and the control circuit 400 may be implemented in at least one integrated circuit (IC).

The first input matching circuit unit 110 may perform an individual matching for each of the first and second band signals SB1 and SB2. As an example, the first input matching circuit unit 110 may include matching elements M1 and M2 for matching impedance for each of the first and second band signals SB1 and SB2.

The second input matching circuit unit 120 may perform an individual matching for each of the third and fourth band signals SB3 and SB4. As an example, the second input matching circuit unit 120 may include matching elements M3 and M4 for matching impedance for each of the third and fourth band signals SB3 and SB4.

For example, the matching elements M1, M2, M3, and M4 may be inductance elements such as coils having impedance optimized for matching for each of the bands.

Referring to FIGS. 1 and 2, the control circuit 400 may set a predetermined MIMO communications scheme or a carrier aggregation (CA) communications scheme by receiving a data signal SD for setting a communications scheme, and may perform an amplification control and a switching control for the first and second low noise amplifiers 210 and 220 and the output DPDT circuit 300 in response to the MIMO communications scheme or the carrier aggregation (CA) communications scheme which is set.

For example, the control circuit 400 may control the first and second low noise amplifiers 210 and 220 and the output DPDT circuit 300 for MIMO communications or carrier aggregation (CA) communications.

The first low noise amplifier 210 may include a common gate structure cascoded with a parallel common source structure to amplify one band signal among the first and second band signals SB1 and SB2 in response to the amplification control of the control circuit 400.

The second low noise amplifier 220 may include a common gate structure cascoded with a parallel common source structure to amplify one band signal among the third and fourth band signals SB3 and SB4 in response to the amplification control of the control circuit 400.

For example, the first and second band signals SB1 and SB2 may be a B30 signal and a B40 signal, respectively, and the third and fourth band signals SB3 and SB4 may be a B7 signal and a B41 signal, respectively. The first to fourth band signals are not limited to these specific band signals.

The output DPDT circuit 300 may include a first input terminal IN1 connected to the first low noise amplifier 210, a second input terminal IN2 connected to the second low nose amplifier 220, and a first output terminal RFOUT1 and a second output terminal RFOUT2 that output signals through the first input terminal IN1 and the second input terminal IN2, to thereby respond to the switching control of the control circuit 400.

In the respective drawings, unnecessarily overlapped descriptions are possibly omitted for components having the same reference numeral and the same function, and differences in the respective drawings will be described.

Figure 3:
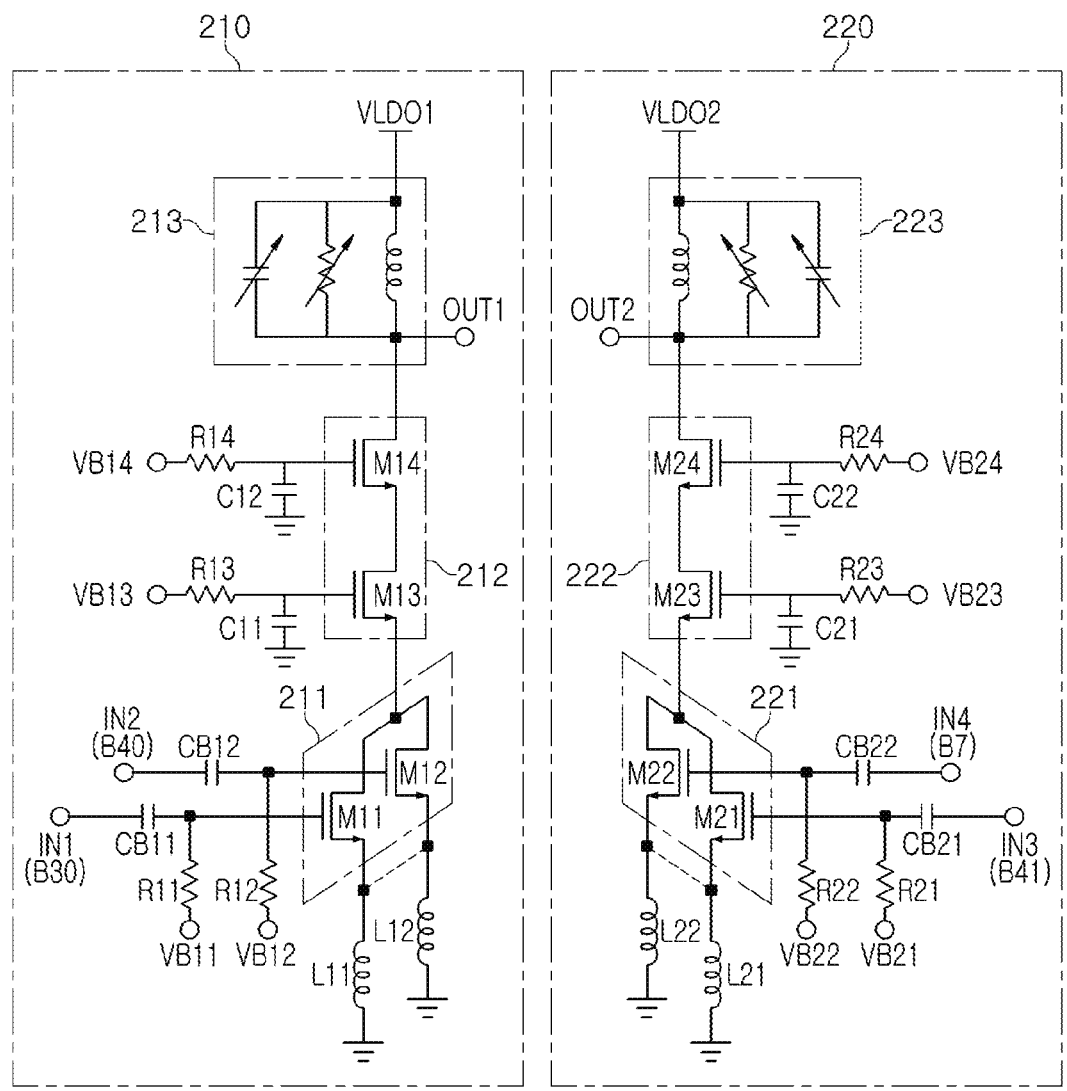
FIG. 3 is a schematic view of first and second low noise amplifiers according to an example.

FIG. 3 is a schematic view of first and second low noise amplifiers according to an example.

Referring to FIGS. 1 through 3, the first low noise amplifier 210 may include a first common source amplifier circuit 211 and a first common gate amplifier circuit 212.

The first common source amplifier circuit 211 may include parallel common source transistors M11 and M12 to amplify one signal selected from the first and second band signals SB1 and SB2. The first common gate amplifier circuit 212 may include common gate transistors M13 and M14 cascoded with the parallel common source transistors M11 and M12 of the first common source amplifier circuit 211 to amplify the signal amplified by the first common source amplifier circuit 211. For example, the first common gate amplifier circuit 212 may have a gain that is smaller than that of the first common source amplifier circuit 211 and is 1 or more, but is not limited to such a configuration.

In addition, the second low noise amplifier 220 may include a second common source amplifier circuit 221 and a second common gate amplifier circuit 222.

The second common source amplifier circuit 221 may include parallel common source transistors M21 and M22 to amplify one signal selected from the third and fourth band signals SB3 and SB4. The second common gate amplifier circuit 222 may include common gate transistors M23 and M24 cascoded with the parallel common source transistors M21 and M22 of the second common source amplifier circuit 221 to amplify the signal amplified by the second common source amplifier circuit 221. For example, the second common gate amplifier circuit 222 may have a gain that is smaller than that of the second common source amplifier circuit 221 and is 1 or more, but is not limited to such a configuration.

The first low noise amplifier 210 may include a first output impedance circuit 213, and the second low noise amplifier 220 may include a second output impedance circuit 223.

The first output impedance circuit 213 may be connected between an output terminal of the first low noise amplifier 210 and a first power supply VLDO1 terminal. The second output impedance circuit 223 may be connected between an output terminal of the second low noise amplifier 220 and a second power supply VLDO2 terminal.

Referring to FIG. 3, bias voltages VB11 and VB12 may be supplied to gates of the parallel common source transistors M11 and M12 of the first common source amplifier circuit 211 through the respective bias resistors R11 and R12, DC blocking capacitors CB11 and CB12 may be connected to the first and second input terminals IN1 and IN2 of the first low noise amplifier 210, and degeneration inductors L11 and L12 may be connected to sources of the parallel common source transistors M11 and M12. Bias voltages VB13 and VB14 may be supplied to gates of the two common gate transistors M13 and M14 connected in a stack structure in the first low noise amplifier 210 through the respective bias resistors R13 and R14, and capacitors C11 and C12 may be connected between the gates of the common gate transistors M13 and M14 and a ground.

Bias voltages VB21 and VB22 may be supplied to gates of the parallel common source transistors M21 and M22 of the second common source amplifier circuit 221 through the respective bias resistors R21 and R22, DC blocking capacitors CB21 and CB22 may be connected to the third and fourth input terminals IN3 and IN4 of the second low noise amplifier 220, and degeneration inductors L21 and L22 may be connected to sources of the parallel common source transistors M21 and M22. Bias voltages VB23 and VB24 may be supplied to gates of the common gate transistors M23 and M24 connected in a stack structure in the second low noise amplifier 220 through the respective bias resistors R23 and R24, and capacitors C21 and C22 may be connected between the gates of the common gate transistors M23 and M24 and a ground.

For example, a process in which the first low noise amplifier 210 selects and amplifies the B30 band signal from among the B30 band signal through the first input terminal IN1 and a B40 band signal through the second input terminal IN2 is described next.

When the first power supply VLDO1 and the bias voltages VB11, VB13, and VB14 are supplied and the second power supply VLDO2 and the bias voltages VB12, VB21, VB22, VB23, and VB24 are not supplied, one common source transistor M11 of the parallel common source transistors M11 and M12 of the first common source amplifier circuit 211 may operate such that the B30 band signal may be selected and amplified. Then, the B30 band signal may be amplified by the common gate transistors M13 and M14 and be output through the output terminal OUT1 of the first low noise amplifier 210.

For example, a process in which the second low noise amplifier 220 selects and amplifies the B41 band signal from among the B41 band signal through the third input terminal IN3 and a B7 band signal through the fourth input terminal IN4 is described next.

When the second power supply VLDO2 and the bias voltages VB21, VB23, and VB24 are supplied and the first power supply VLDO1 and the bias voltages VB22, VB11, VB12, VB13, and VB14 are not supplied, one common source transistor M21 of the parallel common source transistors M21 and M22 of the second common source amplifier circuit 221 may operate such that the B41 band signal may be selected and amplified. Then, the B41 band signal may be amplified by the common gate transistors M23 and M24 and be output through the output terminal OUT2 of the second low noise amplifier 220.

In the low noise amplifier circuits illustrated in FIGS. 1 through 3, in order to improve input and output isolation characteristics, each of the first low noise amplifier 210 and the second low noise amplifier 220 uses a total of three-stage stacked amplification structure of one-stage amplification including the parallel common source transistors and a two-stage amplification including the stacked common gate transistors. Here, the parallel common source transistors M11 and M12 or M21 and M22 may use a size optimized for required frequency characteristics. As well, the degeneration inductor may also use a value optimized for each of the bands, which is advantageous for performance optimization.

Each of the first low noise amplifier 210 and the second low noise amplifier 220 may include a structure that selectively turns on/off the two parallel-connected transistors, which are the parallel common source transistors, through the bias voltage among the two input signals to thereby operate one of the two transistors. That is, each of the first low noise amplifier 210 and the second low noise amplifier 220 may include a structure of independently using the parallel common source transistors in the cascode structure and using the stacked common gate transistors by sharing.

In order to obtain the performance optimized for the used frequencies, inductance values included in the first input matching circuit unit 110 and the second input matching circuit unit 120, a capacitance value of a DC blocking capacitor, and an inductance value of the degeneration inductor may be set to different values.

Figure 4:
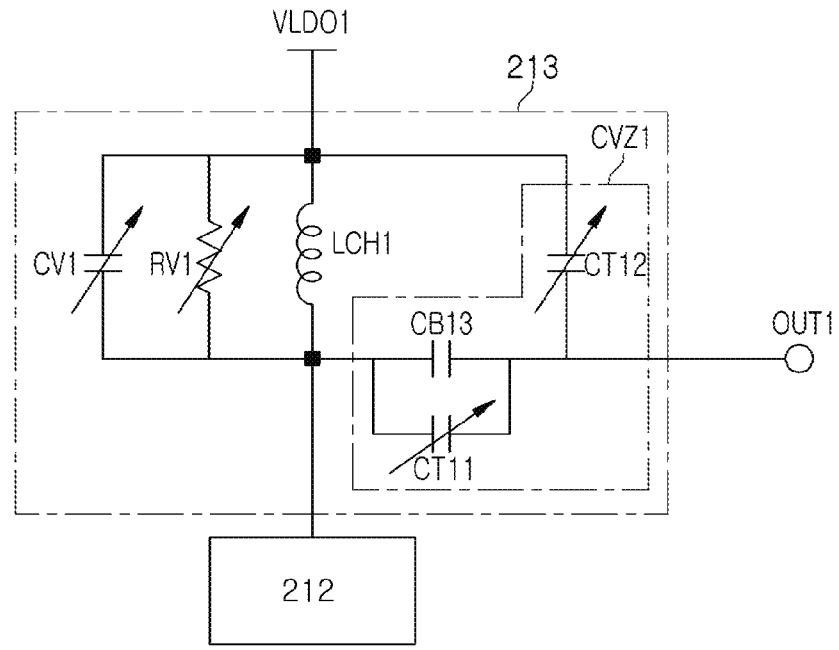
FIG. 4 is a schematic view of the first output impedance circuit of FIG. 3.

FIG. 4 is a schematic view of the first output impedance circuit of FIG. 3.

Referring to FIG. 4, the first output impedance circuit 213 may include a first coil LCH1, a first gain variable resistor RV1, a first frequency variable capacitor CV1, and a first variable impedance circuit CVZ1.

The first coil LCH1 may be connected between the output terminal of the first common gate amplifier circuit 212 and the first power supply VLDO1 terminal and supply a first power, in which an alternating current is removed from the first power supply VLDO1, to the first common gate amplifier circuit 212.

The first gain variable resistor RV1 may include a resistance value that is connected to the first coil LCH1 in parallel and is varied, and may adjust a gain of the first low noise amplifier 210 so as to be suitable for the band signal selected through the variation of the resistance value.

The first frequency variable capacitor CV1 may be connected to the first coil LCH1 in parallel and may adjust a frequency so as to be suitable for the band signal selected for frequency tuning.

The first variable impedance circuit CVZ1 may be connected to the output terminal of the first low noise amplifier 210 to vary output impedance of the first low noise amplifier 210. As an example, the first variable impedance circuit CVZ1 may include a DC blocking capacitor CB13, a first gain variable capacitor CT11, and a second gain variable capacitor CT12.

The DC blocking capacitor CB13 may be connected between the output terminal of the first common gate amplifier circuit 212 and the output terminal of the first low noise amplifier 210 to thereby block a direct current (DC) in a signal from the first common gate amplifier circuit 212 and to transfer only the signal to the output terminal OUT1 of the first low noise amplifier 210.

The first gain variable capacitor CT11 may be connected in parallel to the DC blocking capacitor CB13, and the second gain variable capacitor CT12 may be connected between the first power supply VLDO1 terminal and the output terminal OUT1 of the first low noise amplifier 210 to include a varied capacitance value, and may adjust the gain of the first low noise amplifier 210 so as to be suitable for the band signal selected through the variation of the capacitance value.

Figure 5:
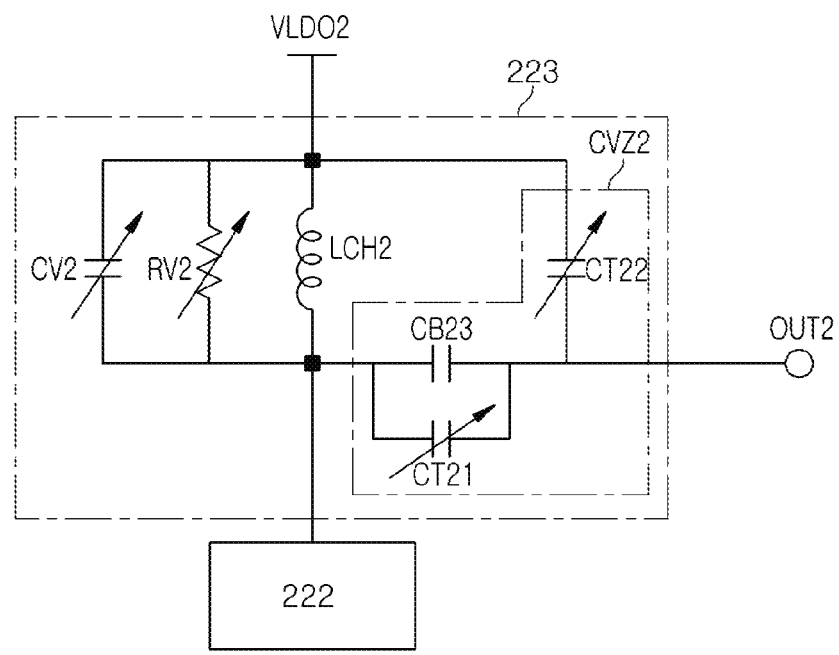
FIG. 5 is a schematic view of the second output impedance circuit of FIG. 3.

FIG. 5 is a schematic view of the second output impedance circuit of FIG. 3.

Referring to FIG. 5, the second output impedance circuit 223 may include a second coil LCH2, a second gain variable resistor RV2, a second frequency variable capacitor CV2 connected to the second coil in parallel LCH2, and a second variable impedance circuit CVZ2.

The second coil LCH2 may be connected between the output terminal of the second low noise amplifier 220 and the second power supply VLDO2 terminal and supply a second power, in which an alternating current is removed from the second power supply VLDO2, to the second common gate amplifier circuit 222.

The second gain variable resistor RV2 may include a resistance value that is connected to the second coil LCH2 in parallel and is varied, and may adjust a gain of the second low noise amplifier 220 so as to be suitable for the band signal selected through the variation of the resistance value.

The second frequency variable capacitor CV2 may be connected to the second coil LCH2 in parallel and may adjust a frequency so as to be suitable for the band signal selected for frequency tuning.

The second variable impedance circuit CVZ2 may be connected to the output terminal of the second low noise amplifier 220 to vary output impedance of the second low noise amplifier 220. As an example, the second variable impedance circuit CVZ2 may include a DC blocking capacitor CB23, a third gain variable capacitor CT21, and a fourth gain variable capacitor CT22.

The DC blocking capacitor CB23 may be connected between the output terminal of the second common gate amplifier circuit 222 and the output terminal of the second low noise amplifier 220 to thereby block a direct current (DC) in a signal from the second common gate amplifier circuit 222 and to transfer only the signal to the output terminal OUT2 of the second low noise amplifier 220.

The third gain variable capacitor CT21 may be connected in parallel to the DC blocking capacitor CB23, and the fourth gain variable capacitor CT22 may be connected between the second power supply VLDO2 terminal and the output terminal OUT2 of the second low noise amplifier 220 to include a varied capacitance value, and may adjust the gain of the second low noise amplifier 220 so as to be suitable for the band signal selected through the variation of the capacitance value.

Figure 6:
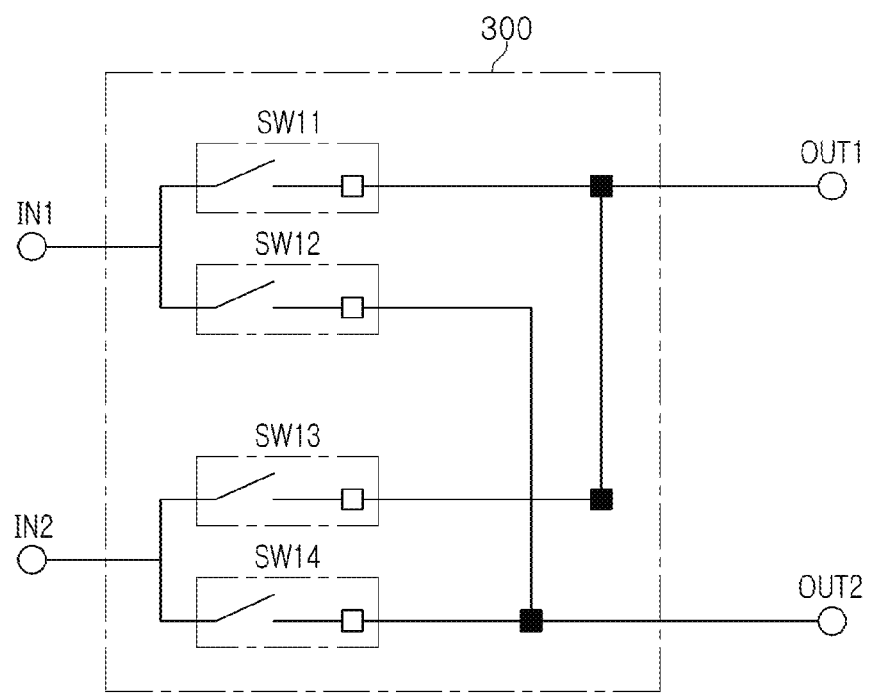
FIG. 6 is a schematic view of an output double-pole double-throw (DPDT) circuit according to an example.

FIG. 6 is a schematic view of an output DPDT circuit according to an example.

Referring to FIG. 6, the output DPDT circuit 300 may include a first switch SW11, a second switch SW12, a third switch SW13, and a fourth switch SW14.

The first switch SW11 may be connected between the first input terminal IN1 of the output DPDT circuit 300 and the first output terminal OUT1 of the output DPDT circuit 300. The second switch SW12 may be connected between the first input terminal IN1 of the output DPDT circuit 300 and the second output terminal OUT2 of the output DPDT circuit 300. The third switch SW13 may be connected between the second input terminal IN2 of the output DPDT circuit 300 and the first output terminal OUT1 of the output DPDT circuit 300. The fourth switch SW14 may be connected between the second input terminal IN2 of the output DPDT circuit 300 and the second output terminal OUT2 of the output DPDT circuit 300.

As an example, in a case in which the B30 band signal is input through the first input terminal IN1 and the B41 band signal is input through the second input terminal IN2, when the first switch SW11 and the fourth switch SW14 are turned on, the B30 band signal and the B41 band signal may be output through the first output terminal OUT1 and the second output terminal OUT2, respectively.

Figure 7:
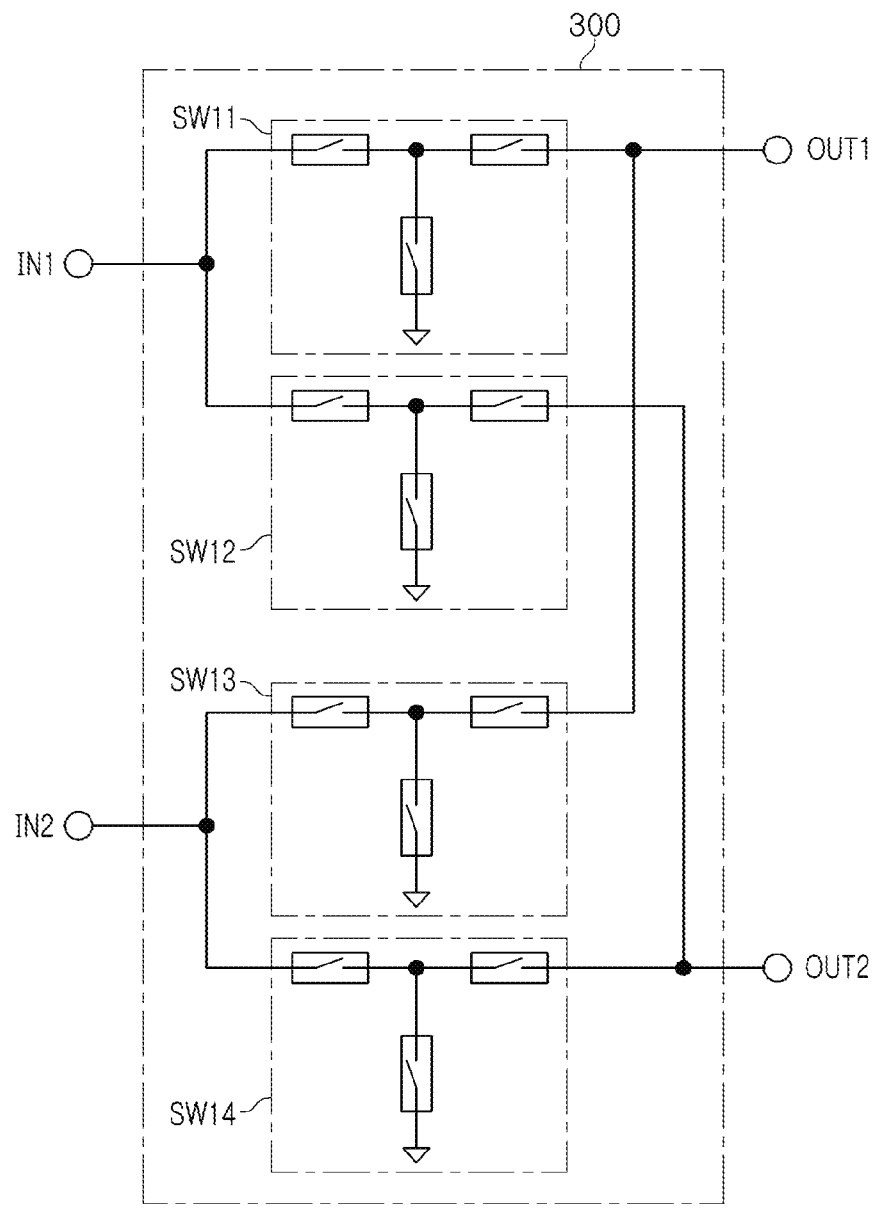
FIG. 7 is an illustrative view of the output DPDT circuit of FIG. 6.

FIG. 7 is an illustrative view of the output DPDT circuit of FIG. 6.

Referring to FIGS. 6 and 7, each of the first to fourth switches SW11 to SW14 may be formed to have a T-shaped structure including three switch elements.

As an example, each of the first to fourth switches SW11 to SW14 may include a third switch element having two first and second switch elements connected in series and connected between a connection node between the first and second switch elements and a ground.

As illustrated in FIGS. 6 and 7, a disadvantage in that isolation characteristics between the outputs may be deteriorated may be supplemented by separately using the output of the amplifier circuit and the output of the switch. As illustrated in FIG. 7, in the case of using a switch structure of a T shaped structure, including a shunt switch element in the middle, isolation characteristics between ports may be further improved.

The low noise amplifier circuit according to examples may simultaneously receive one or two input signals of four input signals, and may also simultaneously output one or two signals. As an example, since B40/B41 performs a TDD operation, it may selectively receive a reception signal through BSSW, and since B7/B30 performs a FDD operation, it may receive the reception signal at the low noise amplifier circuit (LNA) through ANT or external reception. In addition, the low noise amplifier circuit may simultaneously receive two input signals for carrier aggregation (CA), which is possible by selecting one of B30/B40 and B41/B7. This example may correspond to a condition in which two low noise amplifier circuits (LNAs) are simultaneously operated. Reception sensitivity of the overall system may be improved through the operation of the low noise amplifier circuit (LNA).

Meanwhile, the control circuit of the low noise amplifier according to an example may be implemented in a computing environment in which a processor (e.g., a central processing unit (CPU), a graphic processing unit (GPU), a microprocessor, an application specific integrated circuit (ASIC), field programmable gate arrays (FPGAs), and the like), a memory (e.g., a volatile memory (e.g., RAM and the like), a non-volatile memory (e.g., ROM, a flash memory, and the like), an input device (e.g., a keyboard, a mouse, a pen, a voice input device, a touch input device, an infrared camera, a video input device, and the like), an output device (e.g., a display, a speaker, a printer, and the like), and a communication connection device (e.g., a modem, a network interface card (NIC), an integrated network interface, a radio frequency transmitter/receiver, an infrared port, a USB connection device, and the like) are interconnected (e.g., peripheral component interconnection, USB, firmware (IEEE 1394), an optical bus structure, a network, and the like).

The computing environment may be implemented in a personal computer, a server computer, a handheld or a laptop device, a mobile device (a mobile phone, a PDA, a media player, and the like), a multiprocessor system, a consumer electronic device, a mini computer, a mainframe computer, a distributed computing environment including any system or device described above, and the like.

As set forth above, according to an example, the low noise figure (NF) characteristics due to the switching loss may be improved by reducing the number of the switch elements, good amplification gain may be obtained by using a three-stage stack amplification structure in the MIMO LNA structure, the input and output isolation characteristics for each of the bands may be improved, the carrier aggregation (CA) may be supported by using the double pole double throw (DPDT) at the output terminal, and the isolation characteristics between the ports may be improved.

Further, the matching structure for each of the bands is applied to the input terminal instead of the switch structure, such that performance optimization may be achieved by matching optimization for each of the bands.

The examples provide a low noise amplifier circuit capable of improving input and output isolation for each of a plurality of bands and supporting carrier aggregation (CA) communications and multiple-input multiple-output (MIMO) communications.

The examples provide a low noise amplifier circuit capable of optimizing a matching for each of a plurality of bands.

While examples have been shown and described above, it will be apparent to those skilled in the art that modifications and variations could be made without departing from the scope of the present invention as defined by the appended claims.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A low noise amplifier circuit comprising:
a first low noise amplifier comprising a first common gate structure cascoded with a first parallel common source structure and configured to selectively amplify a band signal among a first band signal and a second band signal;
a second low noise amplifier comprising a second common gate structure cascoded with a second parallel common source structure and configured to selectively amplify a band signal among a third band signal and a fourth band signal;
an output double pole double throw (DPDT) circuit comprising a first input terminal connected to the first low noise amplifier, a second input terminal connected to the second low noise amplifier, and a first output terminal and a second output terminal configured to output signals input through the first input terminal and the second input terminal; and
a control circuit configured to perform an amplification control and a switching control for the first and second low noise amplifiers and the output DPDT circuit in response to a multiple input multiple output (MIMO) communications scheme or a carrier aggregation (CA) communications scheme.

2. The low noise amplifier circuit of claim 1, wherein the first low noise amplifier comprises:
a first common source amplifier circuit comprising a first parallel common source transistor and configured to amplify the band signal among the first band signal and the second band signal; and
a first common gate amplifier circuit comprising a first common gate transistor cascoded with the first parallel common source transistor and configured to amplify the band signal that has been amplified by the first common source amplifier circuit.

3. The low noise amplifier circuit of claim 2, wherein the second low noise amplifier comprises:
a second common source amplifier circuit comprising a second parallel common source transistor and configured to amplify the selected band signal among the third and fourth band signals; and
a second common gate amplifier circuit comprising a second common gate transistor cascoded with the second parallel common source transistor and configured to amplify the selected band signal that has been amplified by the second common source amplifier circuit.

4. The low noise amplifier circuit of claim 1, wherein the first low noise amplifier comprises a first output impedance circuit connected between an output terminal of the first low noise amplifier and a first power supply terminal, and
the first output impedance circuit comprises:
a first coil connected between the output terminal of the first low noise amplifier and the first power supply terminal;
a first gain variable resistor connected to the first coil in parallel;
a first frequency variable capacitor connected to the first coil in parallel; and
a first variable impedance circuit connected to the output terminal of the first low noise amplifier and configured to vary output impedance of the first low noise amplifier.

5. The low noise amplifier circuit of claim 4, wherein the second low noise amplifier comprises a second output impedance circuit connected between an output terminal of the second low noise amplifier and a second power supply terminal, and
the second output impedance circuit comprises:
a second coil connected between the output terminal of the second low noise amplifier and the second power supply terminal;
a second gain variable resistor connected to the second coil in parallel;
a second frequency variable capacitor connected to the second coil in parallel; and
a second variable impedance circuit connected to the output terminal of the second low noise amplifier and configured to vary output impedance of the second low noise amplifier.

6. The low noise amplifier circuit of claim 1, wherein the output DPDT circuit comprises:
a first switch connected between the first input terminal and the first output terminal;
a second switch connected between the first input terminal and the second output terminal;
a third switch connected between the second input terminal and the first output terminal; and
a fourth switch connected between the second input terminal and the second output terminal.

7. The low noise amplifier circuit of claim 6, wherein each of the first switch, the second switch, the third switch, and the fourth has a T-shaped structure including three switch elements.

8. A low noise amplifier circuit comprising:
a first input matching circuit configured to perform individual matching for each of a first band signal and a second band signal;
a second input matching circuit configured to perform individual matching for each of a third band signal and a fourth band signal;
a first low noise amplifier comprising a first common gate structure cascoded with a first parallel common source structure and configured to selectively amplify a band signal among the first band signal and the second band signal in response to an input amplification control;
a second low noise amplifier comprising a common gate structure cascoded with a first parallel common source structure and configured to selectively amplify a band signal among the third band signal and the fourth band signal in response to the input amplification control; and
control circuit configured to perform an amplification control of the first and second low noise amplifiers and a switching control for outputs of the first and second low noise amplifiers in response to a multiple input multiple output (MIMO) communications scheme or a carrier aggregation (CA) communications scheme.

9. The low noise amplifier circuit of claim 8, wherein the first low noise amplifier comprises:
a first common source amplifier circuit comprising a first parallel common source transistor and configured to amplify the band signal among the first band signal and the second band signal; and
a first common gate amplifier circuit comprising a first common gate transistor cascoded with the first parallel common source transistor and configured to amplify the band signal that has been amplified by the first common source amplifier circuit.

10. The low noise amplifier circuit of claim 9, wherein the second low noise amplifier comprises:

a second common source amplifier circuit having a second parallel common source structure and configured to amplify the selected band signal among the third band signal and the fourth band signal; and a second common gate amplifier circuit comprising a second common gate transistor cascoded with the second parallel common source transistor and configured to amplify the selected band signal that has been amplified by the second common source amplifier circuit.

11. The low noise amplifier circuit of claim 8, wherein the first low noise amplifier comprises a first output impedance circuit connected between an output terminal of the first low noise amplifier and a first power supply terminal, and the first output impedance circuit comprises:
a first coil connected between the output terminal of the first low noise amplifier and the first power supply terminal;
a first gain variable resistor connected to the first coil in parallel;
a first frequency variable capacitor connected to the first coil in parallel; and
a first variable impedance circuit connected to the output terminal of the first low noise amplifier and configured to vary output impedance of the first low noise amplifier.

12. The low noise amplifier circuit of claim 11, wherein the second low noise amplifier comprises a second output impedance circuit connected between an output terminal of the second low noise amplifier and a second power supply terminal, and the second output impedance circuit comprises:
a second coil connected between the output terminal of the second low noise amplifier and the second power supply terminal;
a second gain variable resistor connected to the second coil in parallel;
a second frequency variable capacitor connected to the second coil in parallel; and
a second variable impedance circuit connected to the output terminal of the second low noise amplifier and configured to vary output impedance of the second low noise amplifier.

13. The low noise amplifier circuit of claim 8, further comprising:
an output double pole double throw (DPDT) circuit comprising a first input terminal connected to the first low noise amplifier, a second input terminal connected to the second low noise amplifier, and a first output terminal and a second output terminal configured to output signals input through the first input terminal and the second input terminal in response to an input switching control from the control circuit, wherein the output DPDT circuit comprises:
a first switch connected between the first input terminal and the first output terminal;
a second switch connected between the first input terminal and the second output terminal;
a third switch connected between the second input terminal and the first output terminal; and
a fourth switch connected between the second input terminal and the second output terminal.

14. The low noise amplifier circuit of claim 13, wherein each of the first switch, the second switch, the third switch, and the fourth switch is formed to have a T-shaped structure including three switch elements.

15. A low noise amplifier comprising:
a first input terminal;
a second input terminal;
an output terminal;
parallel common source transistors configured to receive a first band signal through the first input terminal and a second band signal through the second input terminal and to selectively amplify one of the first band signal and the second band signal;
common gate transistors cascoded with the parallel common source transistors and configured to amplify the selected one of the first band signal and the second band signal that has been amplified by the parallel common source transistors; and
an output impedance circuit connected to the output terminal and configured to vary output impedance of the low noise amplifier, wherein the output impedance circuit comprises:
a coil connected between the output terminal and a power supply terminal,
a gain variable resistor connected in parallel to the coil, and
a frequency variable capacitor connected in parallel to the coil.

16. The low noise amplifier of claim 15, wherein the output impedance circuit comprises:
a direct current blocking capacitor connected between an output of the common gate transistors and the output terminal,
a first gain variable capacitor connected in parallel to the direct current blocking capacitor, and
a second gain variable capacitor connected between the power supply terminal and the output terminal.

17. The low noise amplifier of claim 15, wherein the parallel common source transistors are configured to selectively amplify the one of the first band signal and the second band signal based on a received amplification control signal.

18. The low noise amplifier of claim 15, wherein the parallel common source transistors are configured to selectively amplify the one of the first band signal and the second band signal based on a multiple input multiple output communications scheme or a carrier aggregation communications scheme.

* * * * *